(12) United States Patent
Nakayama

(10) Patent No.: US 7,099,907 B1
(45) Date of Patent: Aug. 29, 2006

(54) FIR FILTER AND RAMP-UP/-DOWN CONTROL CIRCUIT USING THE SAME

(75) Inventor: Masahiko Nakayama, Minato-ku (JP)

(73) Assignee: NEC Corp., (JP)

( * ) Notice: Subject to any disclaimer, the term of this patent is extended or adjusted under 35 U.S.C. 154(b) by 940 days.

(21) Appl. No.: 09/705,050

(22) Filed: Nov. 2, 2000

(30) Foreign Application Priority Data

Nov. 4, 1999   (JP)   ................................. 11-313164

(51) Int. Cl.
*G06F 17/10*   (2006.01)

(52) U.S. Cl. ...................................... 708/300

(58) Field of Classification Search ........ 708/300–323, 708/422–426; 348/619; 333/18; 375/232
See application file for complete search history.

(56) References Cited

U.S. PATENT DOCUMENTS

| | | | | |
|---|---|---|---|---|
| 4,044,241 A | * | 8/1977 | Hatley, Jr. | 708/322 |
| 4,136,398 A | * | 1/1979 | Eggermont | 708/301 |
| 4,584,659 A | * | 4/1986 | Stikvoort | 708/313 |
| 4,611,305 A | | 9/1986 | Iwase | |
| 4,779,128 A | * | 10/1988 | Johannes et al. | 348/619 |
| 4,872,184 A | * | 10/1989 | Yamaguchi et al. | 375/232 |
| 5,311,459 A | | 5/1994 | D'Luna et al. | |
| 5,422,606 A | * | 6/1995 | Tanaka | 333/18 |
| 5,636,151 A | * | 6/1997 | Ikeda | 708/322 |
| 6,058,407 A | * | 5/2000 | Kim | 708/319 |
| 6,192,386 B1 | * | 2/2001 | Shinde | 708/313 |
| 6,279,021 B1 | * | 8/2001 | Takano et al. | 708/319 |
| 6,427,157 B1 | * | 7/2002 | Webb | 708/313 |

FOREIGN PATENT DOCUMENTS

| | | |
|---|---|---|
| GB | 2318005 | 4/1998 |
| JP | 4-373208 | 12/1992 |
| JP | 05-268279 | 10/1993 |
| JP | 06-197136 | 7/1994 |
| JP | 08046485 | 2/1996 |
| JP | 09-046551 | 2/1997 |
| JP | 11-88119 | 3/1999 |

\* cited by examiner

*Primary Examiner*—Kakali Chaki
*Assistant Examiner*—Chat Do
(74) *Attorney, Agent, or Firm*—Dickstein, Shapiro, Morin & Oshinsky, LLP

(57) ABSTRACT

An n-bit shift register 102 for shifting input data through successive bit stages and AND gates 103-$i$ (i being 1 to n) corresponding to the bit stages of the shift register 102 are provided. A control circuit 101 feeds out control signals 107-$i$ for on-off controlling the feeding of the outputs of the corresponding bit stages of the shift register 102. Multipliers 104-$i$ multiply the on-off controlled data and predetermined filter coefficient data, and an adder circuit 105 adds together the output of the multipliers to derive an FIR filter output including ramp-up and -down. A ramp-up/-down signal is fed to a shift register in the control circuit 101, and ramp-up data is derived from the output of the adder circuit 105. Thus, the circuit can be readily constructed without scale increase.

20 Claims, 10 Drawing Sheets

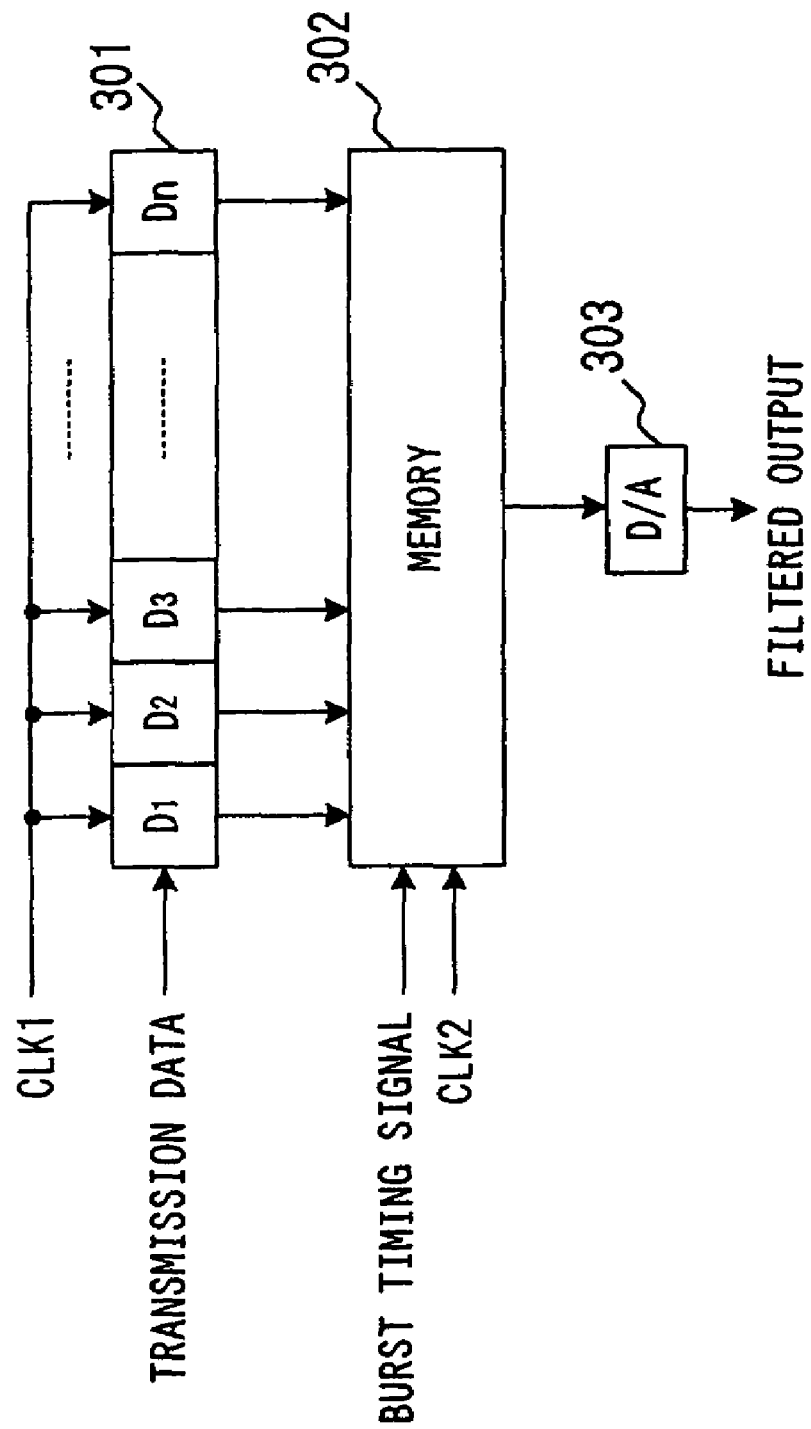

FIR FILTER AND RAMP-UP/-DOWN CONTROL CIRCUIT USING THE SAME

BACKGROUND OF THE INVENTION

The present invention relates to FIR (Finite Impulse Response) filters and ramp-up/-down control circuits using the same and, more particularly, to FIR filters for controlling the transmission power level of a transmission circuit in a radio transmitter/receiver and ramp-up/-down control circuits using the same.

In the usual transmitter for performing CDMA (Code Division Multiple Access) transmission, transmission data is subjected to a digital signal processing circuit to a digital signal process, and then subjected to frame signal processing. The resultant transmission data is subjected to spreading process. Thus obtained transmission data is filtered in an FIR filter for bandwidth limitation. In the FIR filter FIR coefficient or data zero is produced on the basis of a control signal produced from a ramp-up/-down signal which is synchronized to the transmission data and represents the time section of data to be transmitted.

FIG. 10 is a block diagram showing the general construction of the transmitter for the CDMA transmission. As shown in the Figure, a transmitter for CDMA transmission comprises a digital part 121, an analog part 122 and an antenna 123. The digital part 121 includes a digital signal processing circuit 12a for performing digital signal processing (including a spreading process) on transmission data, an FIR filter 12b for bandwidth limiting and a D/A converter 12c for converting digital data to analog signal. The analog part 122 has an LPF (filter) 12d, a modulator 12e, an IF amplifier 12f, a mixer 12g and an RF amplifier 12h.

As is well known in the art, in the transmitting for radio communication, at the start and end of transmission or at the time of burst transmission in time division transmission (including the case of packet transmission), the spectrum of the transmission signal is spread to have adverse effects on the transmitting operation. This is so because when transmission data rises sharply, the spectrum of the transmission signal is greatly spread at the rise time, thus causing frequency-wise interference with other channels. A similar problem arises even at the fall time of the transmission signal. Accordingly, it is prescribed as standard that a ramp-up and a ramp-down time sections are to be normally provided before and after effective transmission data.

Japanese Patent Laid-Open No. 8-46485 discloses a prior art means for solving the above problems. As shown in FIG. 11, the means comprises an n-bit shift register 301 constituted by n bit registers D1 to Dn, a memory 302 and a D/A converter 303. A signal of n bits outputted from the shift register 301 and a burst timing signal which is one-bit signal, constitute a sum bit (i.e., (n+1)-bit) signal, which serves as address signal for the memory 302. The memory 302 is of such a memory capacity which is called by (n+1) bits. The D/A converter 303 converts digital data outputted from the memory 302 to analog signal. An FIR filter can be realized by the above construction.

The FIR filter shown in FIG. 11 performs an operation of reading out a filter output with a ramp-up and a ramp-down parts from the memory 302 under control of the burst timing signal. Therefore, when the tap number (i.e., number of shift register stages) is increased, the memory capacity of the employed memory should also be increased, and therefore the circuit scale is increased.

It is conceivable to effect the ramp-up and -down by controlling GCA (gain control amplifier) analog-wise in such a manner as providing level changes with provision of an output multiplier or providing a separate ramp-up/-down waveform generating circuit and adding a ramp-up/-down signal generated therein to the transmission signal. Even such a method, however, has drawbacks that the power consumption and the circuit scales are increased, and cannot solve the above problems inherent in the prior art.

SUMMARY OF THE INVENTION

The present invention was made for the purpose of solving the above problems in the prior art, and it has an object of providing an FIR filter capable of easily realization of smooth ramp-up and -down without increasing the circuit scale, and also a ramp-up/-down control circuit using the same FIR filter.

According to an aspect of the present invention, there is provided an FIR filter comprising a selection control means for selecting input data, and a multiplying means for multiplying data selected by the selection control means and predetermined filter coefficient, wherein the FIR filter output is derived from the product output of the multiplying means.

According to another aspect of the present invention, there is provided an FIR filter comprising: a selection control means, for selecting input data, including a first n-bit shift register (n being natural number for progressively shifting the input data through the successive stage bits, n switching means provided for the outputs of the n stage bits of the shift register, respectively, for on-off controlling the feed-out of the output of these stage bits, and a control means for on-off controlling the n switching means; and a multiplying means for multiplying data selected by the selection control means and predetermined filter coefficient, wherein the multiplying means provided for the outputs of the n stage bits of the shift register for multiplying outputs fed out from the corresponding stage bits under "on" control of the switching means by predetermined filter coefficients, respectively, and the FIR filter output being derived from the product outputs of the n multiplying circuits.

The control means is constituted by a second n-bit shift register for shifting a ramp-up/-down signal through the successive bit stages under control of a shift clock for the first n-bit shift register; and the n switch means are each an AND gate for receiving the outputs of the corresponding bit stages of the first and second n-bit shift registers as respective inputs.

The control means is a second n-bit shift register for shifting a ramp-up/-down signal on the basis of the shift clock signal of the first n-bit shift register; and the n switching means are n switches provided for the bit stages of the second n-bit shift register for selectively feeding out the filter coefficient data and zero data on the basis of the outputs of the corresponding bit stages.

The control means is a second n-bit shift register for shifting a ramp-up/-down signal through the successive bit stages under control of a shift clock signal for the first n-bit shift register, the outputs of the bit stages of the first n-bit shift register being reset on the basis of the outputs of the corresponding bit stage of the second n-bit shift register.

The FIR filter further comprises a means for changing the shift clock frequency of the first n-bit shift registers.

The shifting operation of the first and second n-bit shift registers are operated under control of shift clock signals at different frequencies.

According to other aspect of the present invention, there is provided a ramp-up circuit comprising the FIR filter according to claim 2 which includes an adder circuit for adding together the outputs of the n multiplying circuits, a ramp-up signal being fed to the first n-bit shift register, the ramp-up data being derived from the sum output of the adder circuit.

According to still other aspect of the present invention, there is provided a ramp-down circuit comprising the FIR filter according to claim 1 which includes an adder circuit adding together the outputs of the n multiplying circuit, a ramp-down signal being fed to the first n-bit shift register, ramp-down data being derived from the sum output of the adder circuit.

In the present invention, in an FIR filter usually used in a radio transmitter for filtering a base-band signal as transmission data, a ramping mechanism is provided, which controls the power level of the transmission data at the time of the start and end of transmission by selecting the filter coefficient on the basis of a ramp-up/-down signal.

Specifically, the feed-out of the output of each of shift register stage is on-off controlled, each of the on-off controlled transmission data is multiplied in a multiplier by a predetermined filter coefficient to derive an FIR filter output from product output thus obtained, a ramp-up/-down signal is inputted to a shift register in a control circuit, and ramp-up/-down data is derived from the output of an adder circuit. No memory for storing any ramp-up/-down filter coefficient need be prepared. It is thus possible to realize smooth ramp-up and -down with a simple construction and without circuit scale increase.

Other objects and features will be clarified from the following description with reference to attached drawings.

BRIEF DESCRIPTION OF THE DRAWINGS

FIG. 11 shows a block diagram of prior art FIR filter.

PREFERRED EMBODIMENTS OF THE INVENTION

Figure 1:
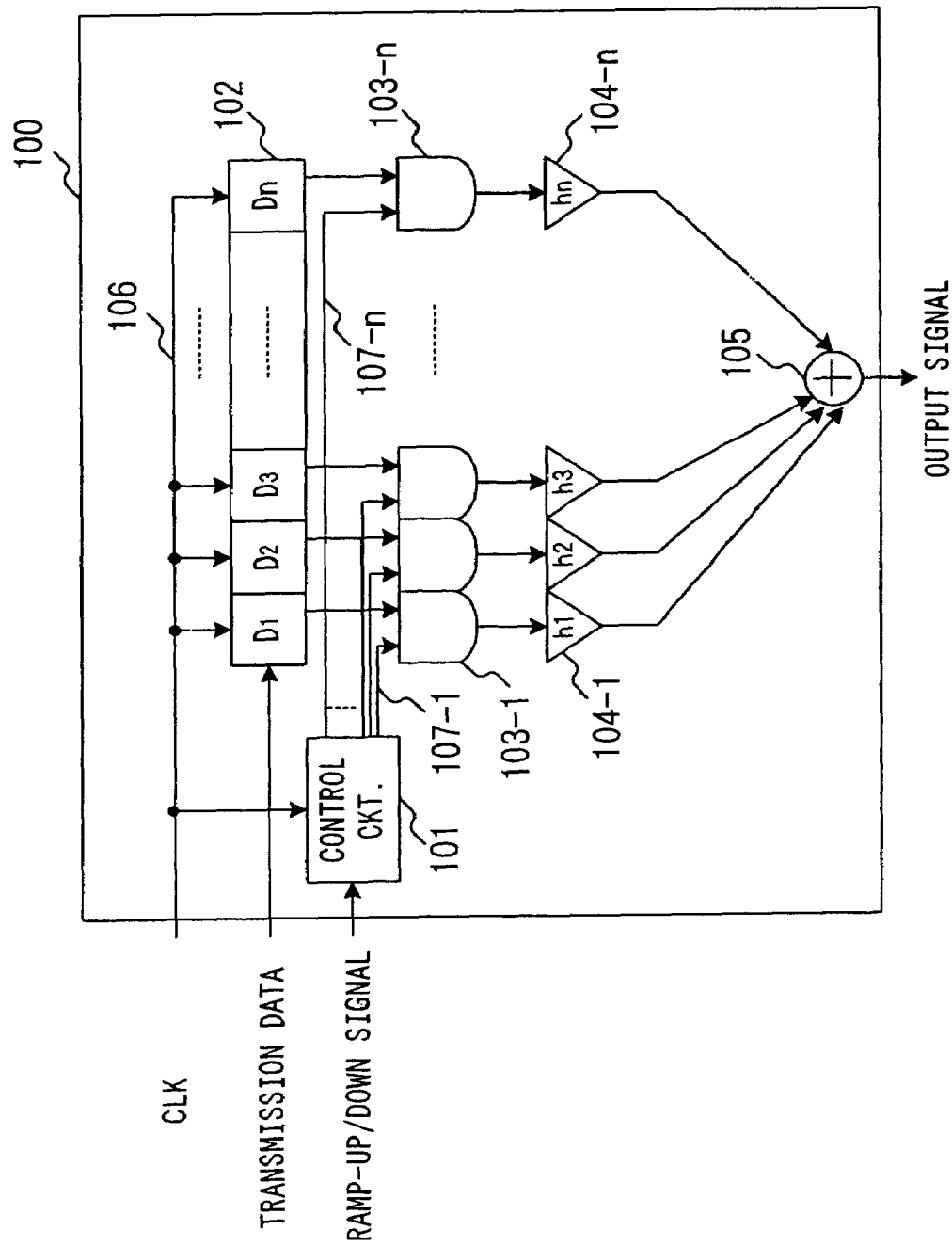
FIG. 1 shows a ramp-up/-down control circuit using an FIR filter according to the present invention.

Preferred embodiments of the present invention will now be described with reference to the drawings. In the Figures to be referred to hereinunder, like parts are designated by like reference numerals.

FIG. 1 is a schematic representation of an embodiment of the ramp-up/-down control circuit using an FIR filter according to the present invention. Referring to the Figure, a ramp-up/-down control circuit 100 comprises a control circuit 101, a shift register 102 constituted by n bit registers D1 to Dn, n AND gates 103-1 to 103-n, n multiplier circuits 104-1 to 104-n each for multiplying the output of each of the AND gates 103-1 to 103-n and an FIR coefficient of the FIR filter, and an adder 105 for adding together the outputs of the multiplier circuits 104-1 to 104-n.

Transmission data to be transmitted is inputted to the bit register D1 of the shift register 102, while clock signal (CLK) 106 is inputted to each of the bit registers Di (i being 1 to n) of the shift register 102. The bit registers Di (i being 1 to n) are connected to one another such that the transmission data inputted to the bit register D1 is progressively shifted from the bit register D1 through the bit registers D2, D3, . . . to the bit register Dn under control of the clock signal 106. The bit registers Di of the shift register 102 each have an output tap, and transmission data are progressively outputted from the taps to the corresponding AND gates 103-1 to 103-n.

The ramp-up/-down signal is synchronized to the transmission data. This signal is inputted to the control circuit 101. The control circuit 101 performs signal processing for the ramp-up and -down. Control signals 107-1 to 107-n which are obtained after the signal processing, are inputted to the AND gates 103-1 to 103-n, respectively. The clock signal 106 is also inputted to the control circuit 101, which is operated under control of system clock.

Figure 2:
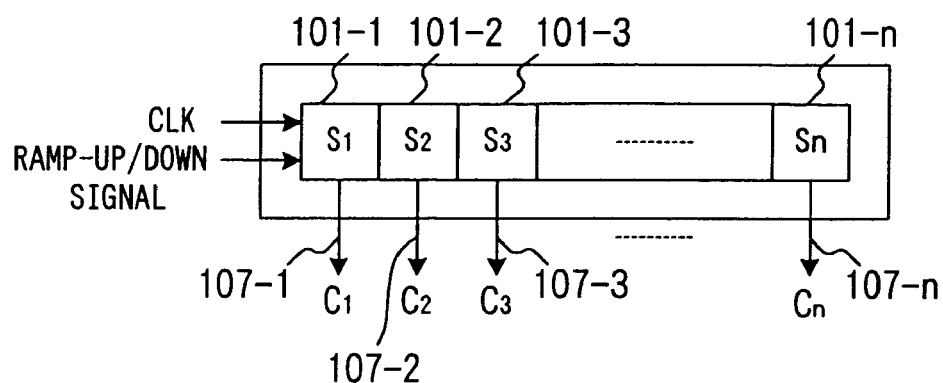
FIG. 2 shows an example of the internal construction of the control circuit 101 in FIG. 1.

An example of the internal construction of the control circuit 101 will now be described with reference to FIG. 2. Referring to the Figure, the control circuit 101 includes a shift registers 101 comprising n bit registers 101-1 to 101-n which receives a ramp-up/-down signal and progressively shifts the input signal at shift timings on the basis of the clock signal. The individual bit registers 101-1 to 101-n output respective control signals 107-i (i being 1 to n). It will be seen that the control circuit 101 performs well-known serial-to-parallel conversion of the inputted ramp-up/-down signal.

Figure 3:
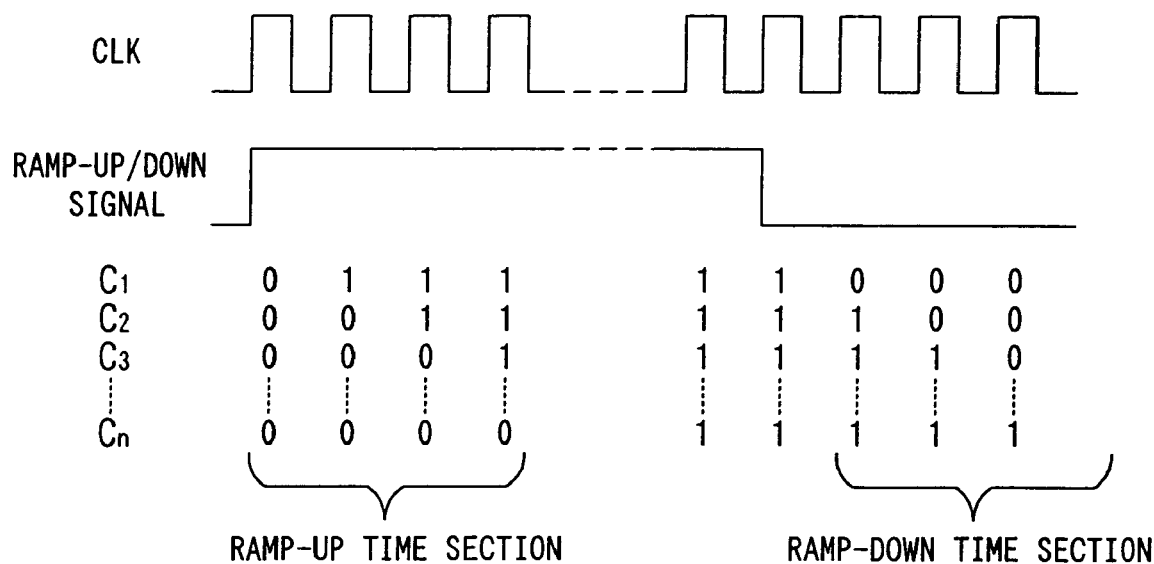
FIG. 3 shows waveforms for explaining the operation of control circuit in FIG. 2.

As shown in FIG. 3, in a ramp-up time section, with input of the ramp-up signal to the control circuit 101 in synchronism to the clock signal, the n bits C1 to Cn of the control signal output are progressively inverted from "0" to "1" from the least significant bit C1. Thus, the ramp-up signal is provided in the form of parallel data of then bits C1 to Cn. The n bits C1 to Cn are finally all inverted to "1".

On the other hand, in a ramp-down time section, with input of the ramp-down signal in synchronism to the clock signal, the n bits C1 to Cn are progressively inverted from "1" to "0" from the least significant bit C1. Thus, the ramp-down signal is obtained in the form of parallel data of the n bits C1 to Cn. In this case, the n bits C1 to Cn are finally all inverted to "0".

The control signals 107-i (i being 1 to n) from the control circuit 101 and transmission data from the taps of the shift register 102 are inputted to the corresponding AND gates 103-i (i being 1 to n), and the outputs therefrom are produced after being multiplied in the multiplier circuits 104-i (i being 1 to n) by FIR coefficients h1 to hn, respectively. The product data obtained by multiplification by the FIR coefficients are added together as transmission data in the adder 105, and the sum data thereof is outputted.

The output signal at instant t from the adder 105 is given as:

$$yt = h1 \cdot xt + h2 \cdot x(t-1) + \cdots + hn \cdot x(t-n)$$

$$= \sum_{k=1}^{t} \{hk \cdot x(t-k)\}$$

Where xt represents the transmission data at instant t.

It is assumed that the multiplier circuits 104-*i* are each constituted by a circuit for generating the FIR coefficient hi (i=1 to n) and a multiplier for multiplying the generated FIR coefficient and transmission data by each other. With this construction of the FIR filter, the output signal from the ramp-up/-down control circuit 100 actually subsequently passes through an D/A converter, a modulator circuit and an analog transmission circuit which outputs power amplified radio wave. These subsequent stage circuits are well known to the person skilled in the art and also has no direct bearing on the present invention, so that they are not described in detail.

Figure 4:
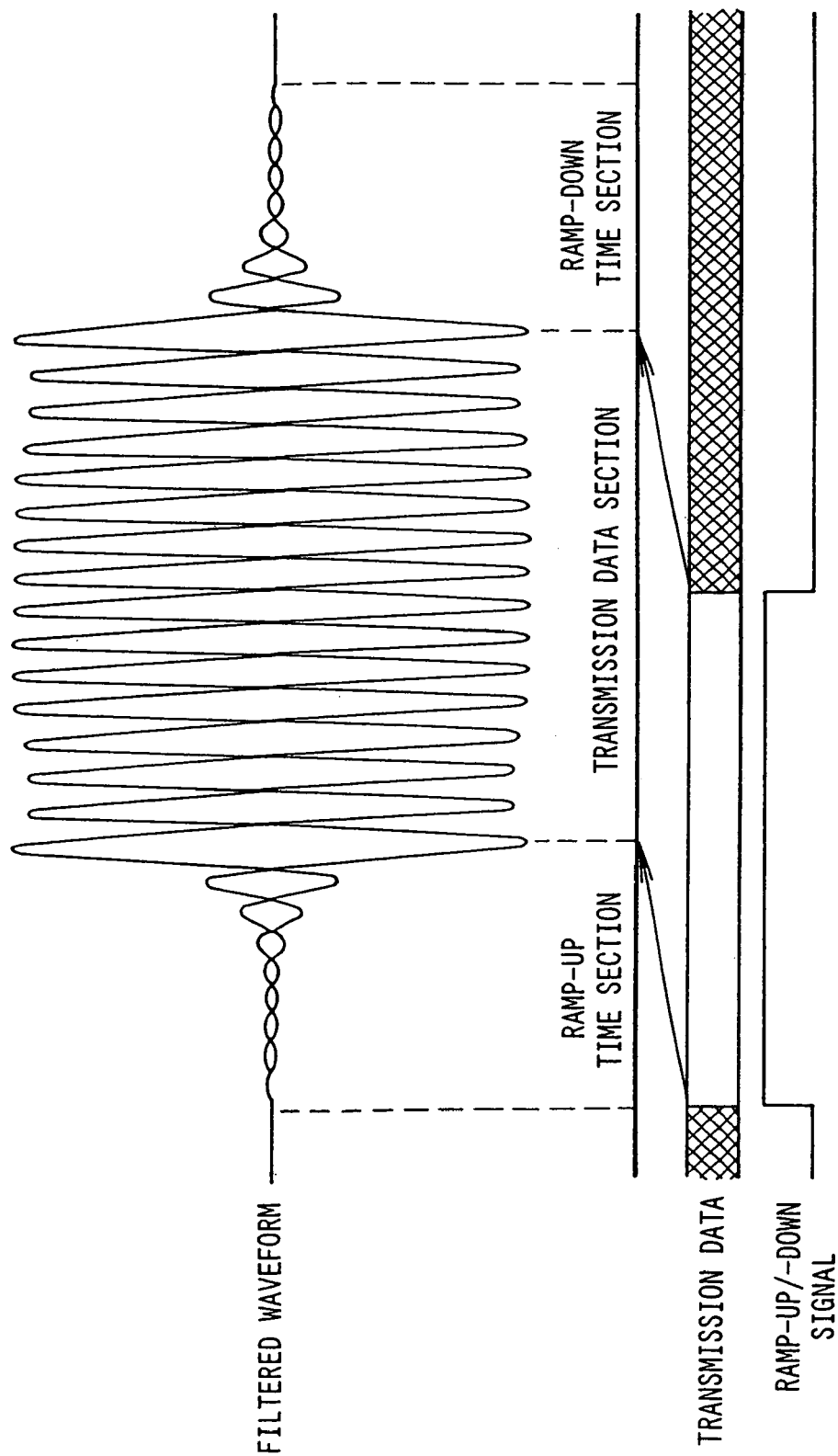
FIG. 4 shows waveforms for explaining the operation of each unit in FIG. 1.

FIG. 4 is a waveform chart showing waveforms after filtering, obtained by simulation of the ramp-up/-down control circuit using the FIR filter. As shown in the Figure, the ramp-up/-down signal is synchronized to the transmission data. The ramp-up/-down signal is inverted from "Low" level to "Hi" level simultaneously with the start of data transmission, and is inverted from "Hi" level to "Low" level simultaneously with the end of data transmission. It is assumed that the transmission data, the ramp-up/-down signal and the clock signal are synchronized to each other.

In an initial stage prior to the start of transmission, the ramp-up/-down signal is at "Low" level. At this time, the control signals 107-*i* from the control circuit 101 are all at "Low" level.

With the start of transmission, the ramp-up/-down signal is inverted to "Hi" level, and the control signals from the control circuit 101 are progressively inverted from "Low" level to "Hi" level under control of the clock signal 106. It will be seen that, as noted before, the control circuit 101 thus performs serial-to-parallel conversion.

With the end or stop of transmission, i.e., with inversion of the ramp-up/-down signals from "Hi" to "Low" level, the control signals 107-*i* from the control circuit 101 are similarly progressively inverted from "Hi" to "Low" level under control of the clock.

Referring again to FIG. 1, the shift register 102 is an n-bit shift register operable under control of the clock signal 106. In synchronism to the rise timing of the clock signal 106 the shift register 102 stores the first bit of the transmission data in its first bit register D1, and in synchronism to the next clock signal rise timing it shifts the transmission data stored in the bit register D1 to the next bit register D2. At this time, the next bit of transmission data is stored in the bit register D1. Likewise, in synchronism to every rise timing of the clock signal inputted thereto, the shift register 102 shifts the transmission data by one bit.

The shift register 102 also outputs transmission data from its taps, and the outputted transmission data are inputted together with the control signals 107-*i* from the control circuit 101 to the AND gates 103-*i*, respectively. When control signal 107-*i* from the control circuit 101 is at "Low" level, the output of the corresponding AND gate 103-*i* is at "Low" level (i.e., zero). When the control signal 107-*i* is at "Hi" level, on the other hand, the AND gate 103-*i* directly passes the data value of the transmission data.

The operation of the ramp-up/-down control circuit at the times of (a) start of transmission, (b) steady-state transmission and (c) end of transmission, will now be described with reference to FIG. 4.

(a) Start of transmission:

At the time of the start of transmission, the control signals 107-*i* from the control circuit 101 are progressively inverted from "Low" level to "Hi" level in synchronism to the clock signal. The transmission data, which have all been zero at the outset, are progressively multiplied by the filter coefficients 104, i.e., h1 to hn, and then added together in synchronism to the clock signal. Thus, as shown in FIG. 4, in a ramp-up time section the output power level (or amplitude) is smoothly increased on the basis of the filter characteristic. The length or interval of the ramp-up time section is determined by the size (i.e., number of bits) of the shift register 102. Usually in a symmetrical n-tap FIR filter the length of the ramp-up time section is n/2×CLK.

(b) Steady-state transmission:

In the state with the ramp-up/-down signal held at "Hi" level (i.e., during transmission), the control signals 107-*i* from the control circuit 101 are all at "Hi" level. Thus, like the usual FIR filter operation the transmission data from the taps of the shift register 102 are multiplied by the respective FIR filter coefficients 104, and the products are added together in the adder 105 to obtain an output signal, which is outputted as FIR filtered transmission data. In FIG. 4, the state during the transmission is shown as transmission data time section.

The FIG. 4 shows an example in the case when the transmission data is the recurrence of "1, −1". The normal transmission data is of a given data series, and also its transmission time interval is based on a transmission format. The actual waveform is thus different from the waveform shown in FIG. 4.

(c) Stop of transmission:

In the ramp-down case, from the state with the control signals 107-*i* from the control circuit 101 all at "Hi" level (i.e., state during transmission) the ramp-up/-down signal is inverted from "Hi" to "Low" level. Thus, the converse operation to that at the time of the start of transmission is brought about, that is, the control signals 107-*i* are progressively inverted from "Hi" to "Low" level. Thus, the product result of multiplification by each filter coefficient corresponding to each control signal 107-*i* at "Low" level becomes zero, and the sum result is progressively reduced. The transmission power level is thus progressively reduced. Consequently, the output power level (i.e., amplitude) is smoothly reduced on the basis of the filter characteristic in a ramp-down time section as shown in FIG. 4.

FIG. 4 shows a simulation waveform obtained with transmission data recurrence of {1, −1} by constituting the shift register with 16 bit registers and operating each bit register with four clock pulses (i.e., a filtering example with four times over-sampling and 64-tap FIR).

It will be seen from the above description that it is possible to obtain the ramp-up/-down control by merely adding the control circuit 101 and the AND gates 103-*i* to the usual FIR filter circuit. In other words, it is possible to construct a ramp-up/-down control circuit without incorporating any memory or complicated control circuit.

While a usual FIR filter construction has been described above, the method of producing the FIR filter coefficients and so forth are not described in detail. The FIR filter coefficients may be generated by a fixed circuit, or they may be taken out from a memory. In addition, while the AND gates are used for on-off controlling the ANDs of the transmission data and the filter coefficients, it is obvious that the same effects are obtainable by replacing the AND gates with switches.

Figure 5:
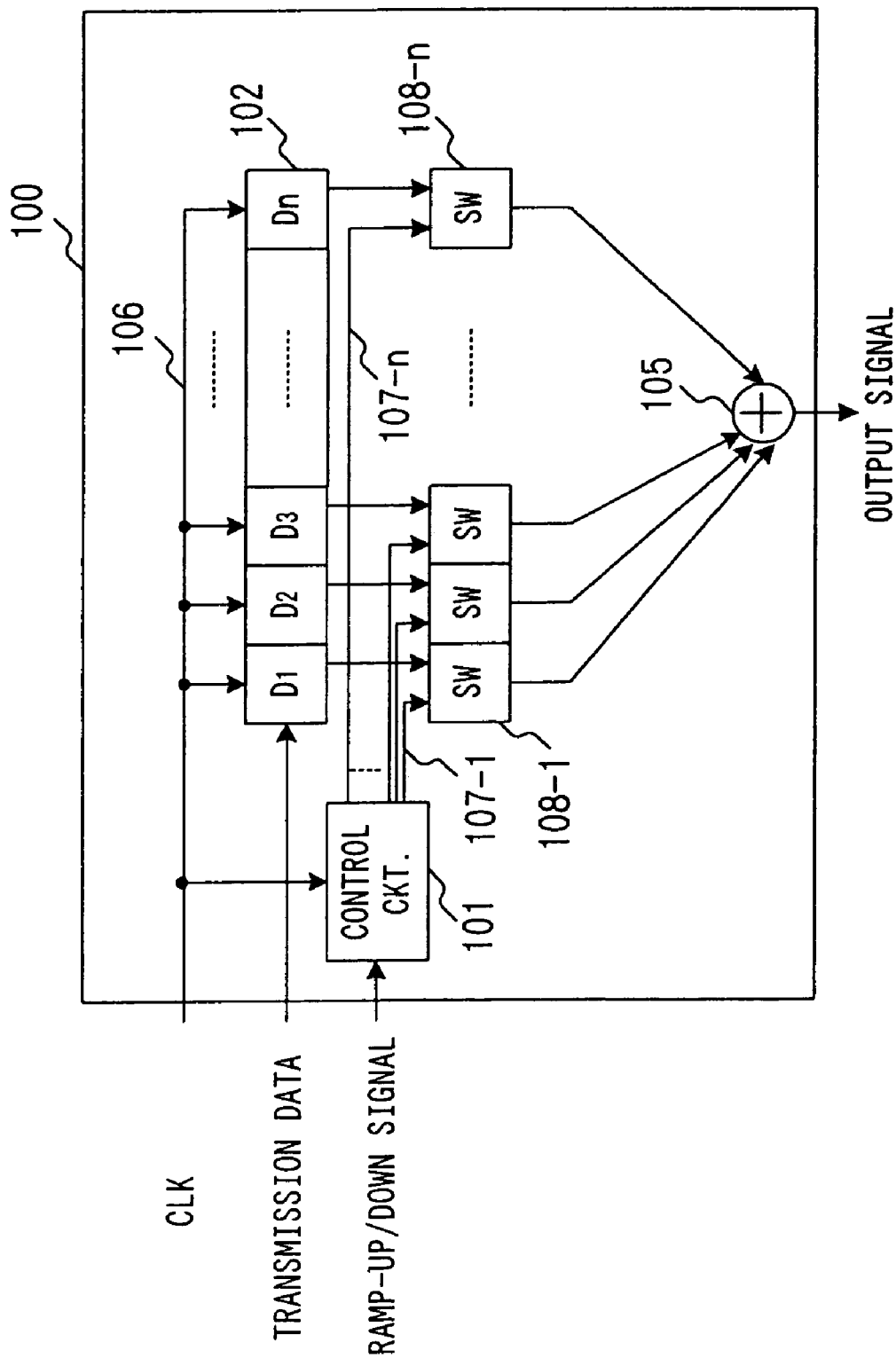
FIG. 5 shows a different embodiment employing switches in lieu of AND gate in FIG. 1.
Figure 6:
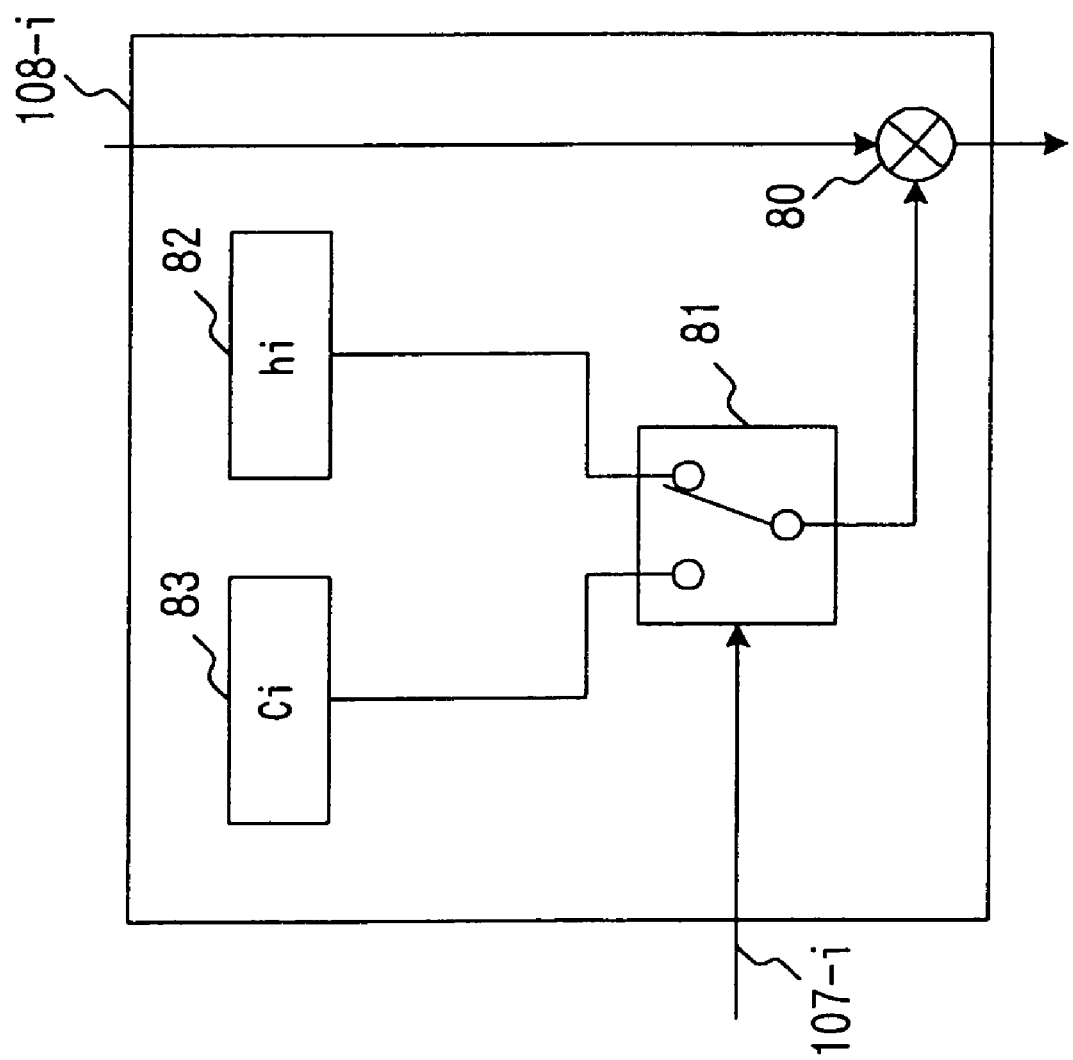
FIG. 6 shows an exemplified circuit of the switch in FIG. 5.

FIG. 5 shows a different embodiment employing switches. Specifically, referring to the Figure, this embodiment uses switch circuits 108-1 to 108-n in lieu of the AND gates 103-i in FIG. 1. As shown in FIG. 6, each switch circuit 108-i (i being 1 to n) each includes a circuit 83 for producing a fixed value Ci (i being 1 to n), a circuit 82 for producing an FIR filter coefficient hi (i being 1 to n), a switch 81 on-off controlled by the control signal 107-i to selectively produce the output of either circuit 83 or 82, and a multiplier 80 for multiplying a signal selected by the switch and the output signal from the corresponding bit register of the shift register 102 by each other. The same effects are thus obtainable by replacing the AND gates with the switches.

Figure 7:
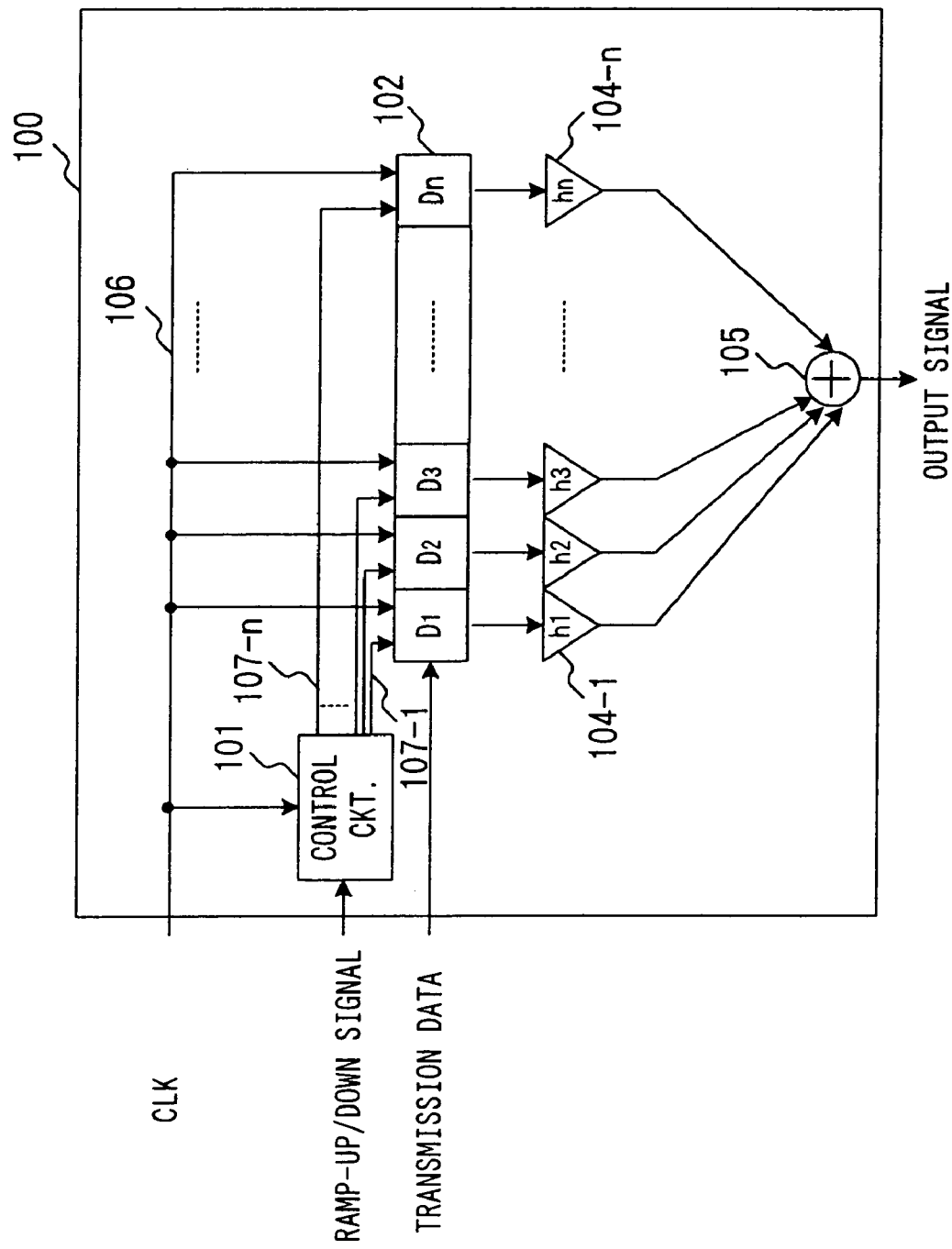
FIG. 7 shows a further embodiment according to the present invention which resets each stage of the shift registers in FIG. 1.

FIG. 7 shows a further embodiment. In this embodiment, neither AND gates nor switches are used. Instead, the bit registers of the shift register 102 are reset individually on the basis of the outputs of the bit registers of the shift register in the control circuit 10, respectively. By resetting the bit registers of the shift register 102, it is possible to select one of two states, i.e., inputting the transmission data as such or zero to the multiplier. The same effects as in the case of using the AND gates or the switches are thus obtainable.

As shown above, according to the present invention the ramp-up and -down are realized without producing transmission data at the ramp-up and -down times by switching a plurality of FIR filter coefficients stored in a memory or effecting the ramp-up and -down by controlling GCA analog-wise as in the prior art but by using FIR filter coefficients at the time of the usual transmission.

In the meantime, in a portable telephone set or the like which should maintain high frequency utilization efficiency, unless the ramp-up of transmission power level at the time of the start of transmission and the ramp-down at the time of the stop of transmission are performed smoothly, spurious data may be generated to interfere with other channels. Particularly in such case as burst transmission, at which time the transmission is frequently started and stopped, it is necessary to have a mechanism which is less subject to spurious data generation. This embodiment of the ramp-up/-down control circuit utilizing the FIR filter coefficients, is theoretically less subject to the spurious data generation. Besides, this embodiment uses neither numbers of memories and multiplies nor exclusive waveform generating means. It is thus possible to simplify the construction and also reduce the circuit scale.

While the cases of inputting a ramp-up and a -down signal have been described, it will be obvious that the present invention is also applicable to the case of inputting either one of the ramp-up and -down signals.

Figure 8:
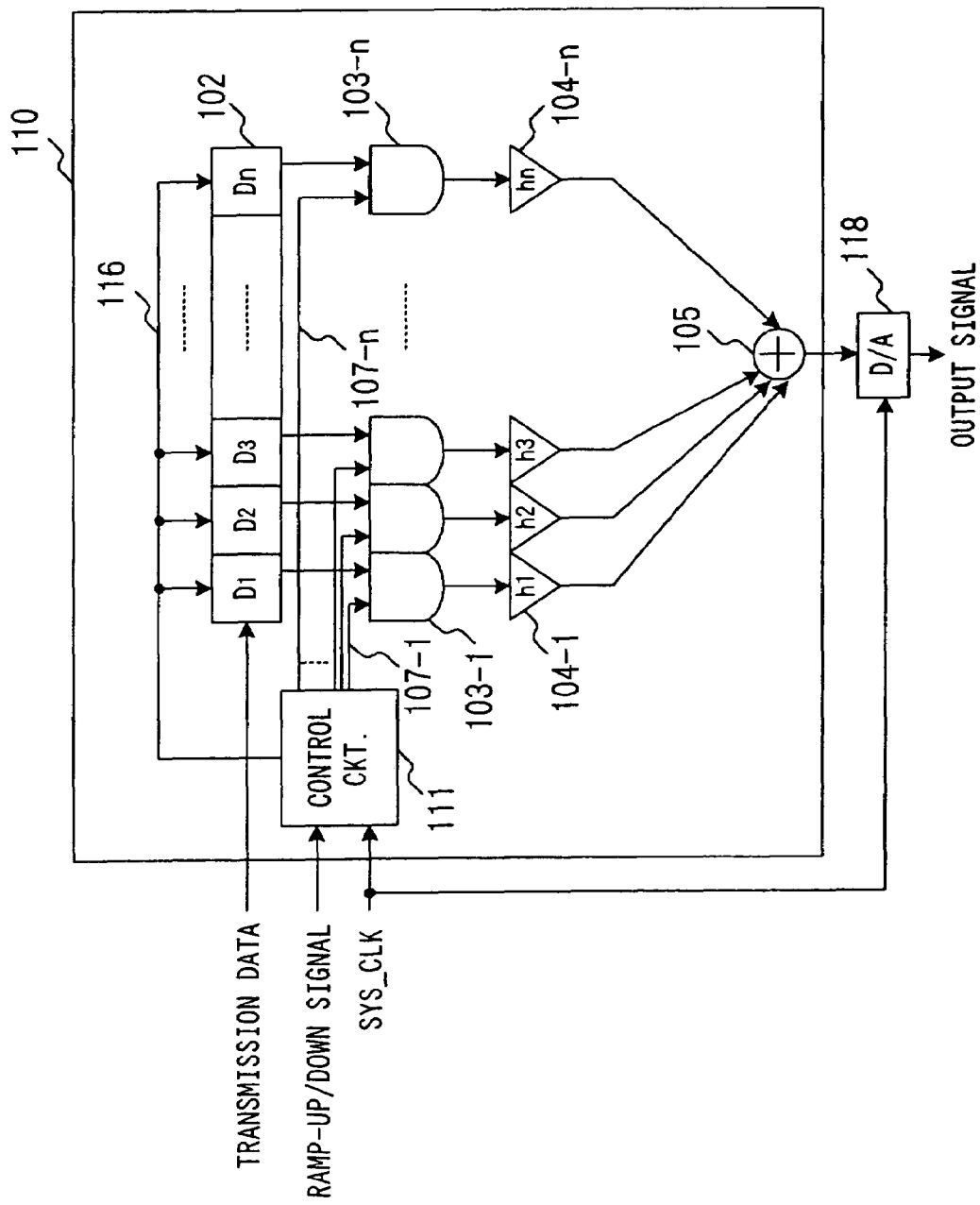
FIG. 8 shows another ramp-up/-down control circuit using an FIR filter according to the present invention.

A further embodiment of the present invention will be described with reference to FIGS. 8 and 9. This embodiment is different from the above embodiments in that it permits control of the ramp-up and -down time sections.

In many cases, the ramp-up and -down time sections are prescribed in the pertinent radio communication system. Usually, it is desirable that spurious data is less generated and that it is possible to promptly start and stop transmission (i.e., provide the ramp-up and -down time sections). From the standpoint of evaluation of the characteristics of the system itself, it seems to be more convenient if it is possible to change the ramp-up and -down time sections. An embodiment in such a case will now be described with reference to FIG. 8.

Referring to the Figure, the difference of this circuit from the circuit shown in FIG. 1 resides in that it is possible to change the length of the ramp-up and -down time sections by adequately using the clock signal. A main structural difference resides in that the clock used in the ramp-up/-down circuit 110 is generated in control circuit 111.

In addition, base system clock signal SYS_CLK is fed to the control circuit 111 and also to a D/A converter 118.

Figure 9:
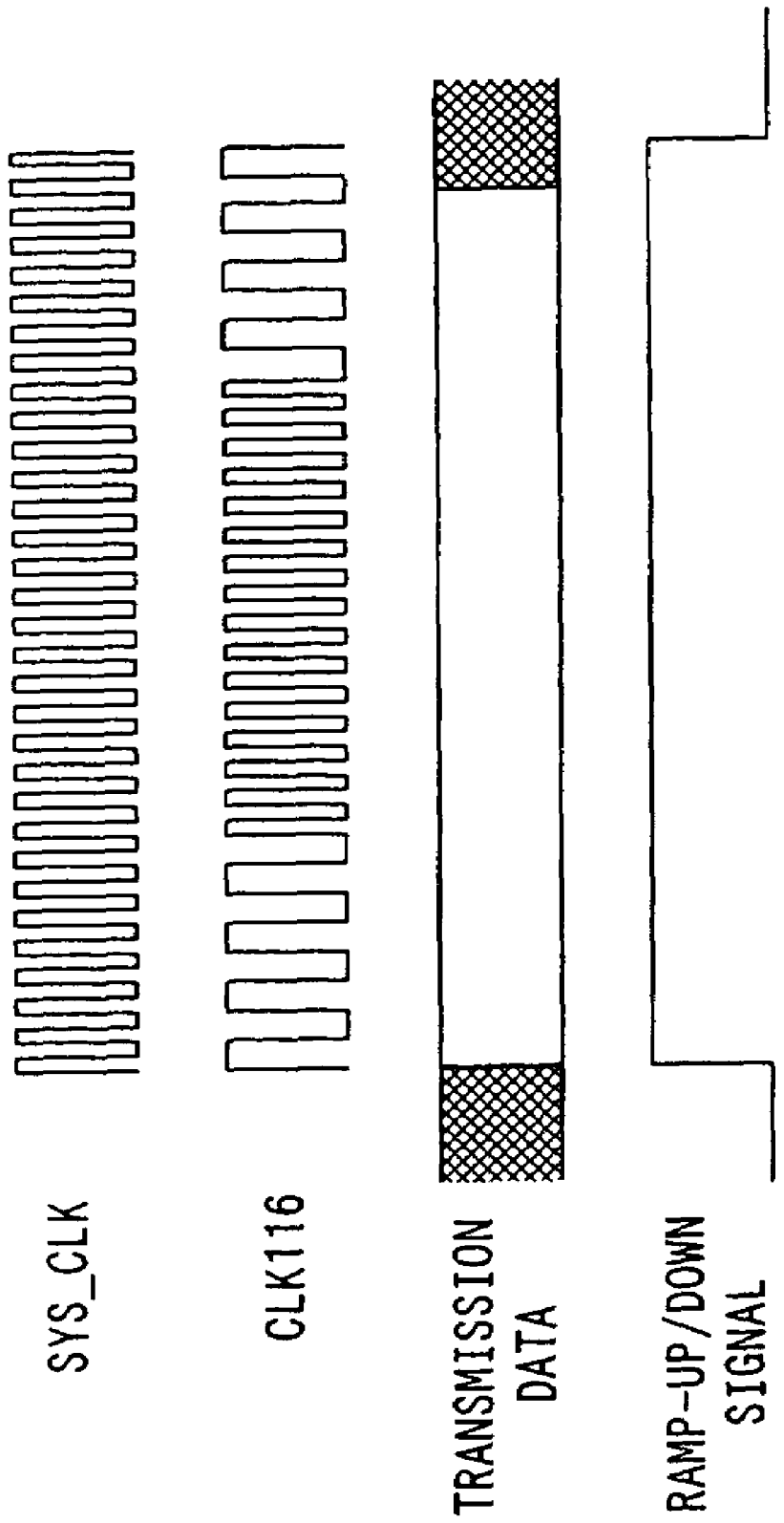
FIG. 9 shows waveform for explaining the operation of each unit in FIG. 8.
Figure 10:
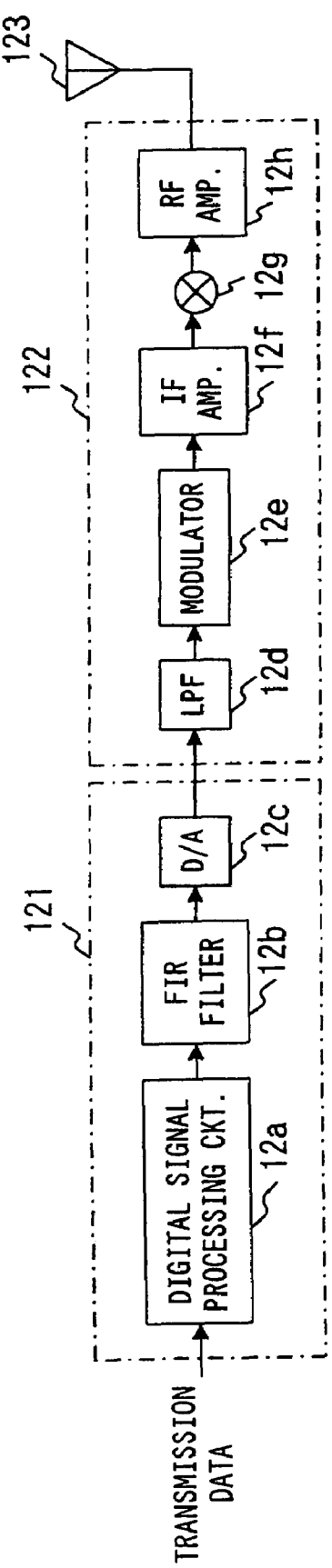
FIG. 10 shows a block diagram showing the general construction of the transmitter for the CDMA transmission.

FIG. 9 is a waveform chart showing an example of the relationship of system clock signal SYS_CLK, clock signal 116, transmission data and ramp-up/-down signal. Referring to the Figure, the clock signal 116 generated in the control circuit 111 is changed only in the ramp-up and -down time sections. In this case, the frequency is doubled in a time section corresponding to one half the number of bit shift registers or the number of taps. The generated clock signal 116 is fed to the shift register 102, and the shift register 102 is thus operated at timings under control of the clock signal 116. Also, at these timings the control signal 107-i fed out from the control circuit 111 is changed. In other words, the two shift registers are operated under control of different shift clocks.

Referring back to FIG. 8, the system clock signal SYS_CLK is fed to the D/A converter 118. Thus, the ramp-up/-down circuit 110 is operated differently in the ramp-up and -down time sections, and the same output time extension is obtained by the ratio between the clock signal 116 and the system clock signal SYS_CLK. It is thus possible to change the total time of the ramp-up and -down time sections. The ratio between the clock signal 116 and system clock SYS-CLK can be readily changed as $2^n$, and it is thus possible to set various ramp-up and -own time sections.

As has been described in the foregoing, according to the present invention at the times of the ramp-up and -down the transmission data or coefficient data is selected by using the FIR filter, which limits bandwidth of the base-band. It is thus possible to easily realize smooth ramp-up and -down without increasing the circuit scale.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A Finite Impulse Response (FIR) filter comprising:
   a selection control means for selecting input data, the selection control means including:
      a first n-bit shift register (n being a natural number) for progressively shifting the input data through successive stage bits,
      n switching means respectively provided for outputs of the n stage bits of the n-bit shift register for controlling the outputs of these n bits, and
      a control means for controlling the n switching means, the control means outputting n unique control signals respectively to the n switching means, the control means further being constituted by a second n-bit shift register for shifting a ramp-up/-down signal through successive bit stages under control of a shift clock for the first n-bit shift register; and a multiplying means for multiplying data selected by the selection control means and a predetermined filter coefficient, wherein a FIR filter output is derived from the product outputs of the n multiplying circuits means.

2. The FIR filter according to claim 1, wherein:
the n switch means are each an AND gate for receiving the outputs of the corresponding bit stages of the first and second n-bit shift registers as respective inputs.

3. The FIR filter according to claim 2, further comprising an adder circuit for adding together the outputs of the n multiplying circuits, wherein a ramp-up signal is fed to the first n-bit shift register, the ramp-up data being derived from the sum output of the adder circuit.

4. The FIR filter according to claim 2, further comprising an adder circuit for adding together the outputs of the n multiplying circuits, wherein a ramp-down signal is fed to the first n-bit shift register, the ramp-down data being derived from the sum output of the adder circuit.

5. The FIR filter according to claim 1, wherein:
the n switching means are n switches provided for bit stages of the second n-bit shift register for selectively feeding out the filter coefficient data and zero data in response to the outputs of the corresponding bit stages.

6. The FIR filter according to claim 1, wherein the outputs of the bit stages of the first n-bit shift register are reset on the basis of the outputs of the corresponding bit stage of the second n-bit shift register.

7. The FIR filter according to claim 1, which further comprises a means for changing a shift clock frequency of the first n-bit shift registers.

8. The FIR filter according to claim 1, wherein the shifting operation of the first and second n-bit shift registers are operated under control of shift clock signals at different frequencies.

9. A Finite Impulse Response (FIR) filter comprising:
a first n-bit shift register that receives an input signal and outputs n first-register output signals;
a control circuit that outputs n unique control signals;
an n-bit combining circuit coupled to the first n-bit shift register and coupled to the control circuit, the combining circuit combining the n output signals of the first n-bit shift register with the n unique control signals of the control circuit, the n-bit combining circuit outputting a combining circuit output signal;
n multipliers coupled to the n-bit combining circuit, each of the multipliers multiplying the combining circuit output signals with n filter coefficients, each of the n multipliers outputting a product; and
an adder coupled to the n multipliers, the adder adding the products of the n multipliers.

10. The FIR filter according to claim 9, wherein the combining circuit consists of n logic gates.

11. The FIR filter according to claim 10, wherein the logic gates are AND gates.

12. The FIR filter according to claim 9, wherein an input to the control circuit is a ramp-up/ramp-down signal.

13. The FIR filter according to claim 9, wherein the control circuit includes a second n-bit shift register.

14. The FIR filter according to claim 13, wherein an input to the control circuit is a ramp-up/ramp-down signal.

15. The FIR filter according to claim 9, further comprising:
a second clock signal supplied to the first n-bit shift register; and
a first clock signal supplied to the control circuit;
wherein the second clock signal has a different frequency than the first clock signal.

16. A Finite Impulse Response (FIR) filter comprising:
a first n-bit shift register that receives an input signal and outputs a first-register output signal;
a control circuit that outputs n unique control signals;
n switching circuits, each switching circuit comprising:
a circuit for producing a fixed value;
a circuit for producing a FIR filter coefficient;
a switch coupled to the control circuit, coupled to the fixed value circuit and coupled to the FIR filter coefficient circuit, each switch selecting either the fixed value or the FIR filter coefficient depending upon the control circuit output signal, outputting a switch selection output;
a multiplier coupled to the switch and coupled to the first n-bit shift register, the multiplier multiplying the switch selection output with a selected one of the n first-register output signals to produce a switching circuit output; and
an adder coupled to the n switching circuits, the adder adding the outputs of the n switching circuits.

17. The FIR filter according to claim 16, wherein an input to the control circuit is a ramp-up/ramp-down signal.

18. The FIR filter according to claim 16, wherein the control circuit includes a second n-bit shift register.

19. The FIR filter according to claim 18, wherein an input to the control circuit is a ramp-up/ramp-down signal.

20. The FIR filter according to claim 16, further comprising:
a second clock signal supplied to the first n-bit shift register; and
a first clock signal supplied to the control circuit;
wherein the second clock signal has a different frequency than the first clock signal.

* * * * *